(12) United States Patent
Hsu

(10) Patent No.: US 6,649,457 B2
(45) Date of Patent: Nov. 18, 2003

(54) METHOD FOR SOI DEVICE ISOLATION

(75) Inventor: Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/963,081

(22) Filed: Sep. 24, 2001

(65) Prior Publication Data

US 2003/0059988 A1 Mar. 27, 2003

(51) Int. Cl.[7] ..................... H01L 21/00; H01L 21/8238; H01L 21/331
(52) U.S. Cl. ................. 438/154; 438/151; 438/149; 438/157; 438/197; 438/199; 438/211; 438/311; 438/977
(58) Field of Search ................. 438/151, 149, 438/154, 157, 197, 199, 211, 311, 977

(56) References Cited

U.S. PATENT DOCUMENTS 6,100,193 A * 8/2000 Surchiro
6,326,251 B1 * 12/2001 Gardner et al.
6,391,716 B1 * 5/2002 Liou
2002/0168802 A1 * 11/2002 Hsu et al.

* cited by examiner

Primary Examiner—John F. Niebling
Assistant Examiner—Stanetta Isaac
(74) Attorney, Agent, or Firm—David C. Ripma; Matthew D. Rabdau; Scott C. Krieger

(57) ABSTRACT

A method of isolating a CMOS device on a silicon on insulator substrate, wherein the substrate includes an insulating layer of top silicon formed thereon, includes growing a gate oxide layer on the top silicon layer; depositing a first layer of material on the gate oxide layer; removing the first layer of material, the gate oxide layer and the top silicon layer from a device field region; forming an insulating cup about the first layer of material, the gate oxide layer and the top silicon layer; depositing a second layer of material over the first layer of material and the insulating cup; etching the first layer of material and the second layer of material to form a gate electrode; implanting ions to form a source region and a drain region; passivating the structure; and metallizing the structure.

25 Claims, 2 Drawing Sheets

METHOD FOR SOI DEVICE ISOLATION

FIELD OF THE INVENTION

This invention relates to CMOS/SOI integrated circuit fabrication, and specifically to a method of isolating a gate electrode from active silicon by non-conventional isolation.

BACKGROUND OF THE INVENTION

Conventional techniques for silicon on insulator (SOI) device isolation include mesa isolation, local oxidation of silicon (LOCOS), and trench isolation.

In the mesa isolation technique, the top silicon layer in the field regions are etched prior to gate oxidation. The active device covers the top and the sidewall of the active areas. The doping density and the crystalline structure at the top silicon surface and the sidewall area are not identical. The gate electrode covers the top silicon to sidewall corner. The gate oxide strength at the corner is weaker than that at the top silicon area. This type of isolation has potential problems because of gate oxide breakdown and sidewall parasitic transistor leakage currents.

The LOCOS technique is the most common isolation process. A thin oxide layer is grown on the field region and a relatively thick layer of silicon nitride is deposited over the oxide. The nitride and oxide pad is etched away from the field region. A high temperature oxidation step is performed to convert all of the top silicon layer in the field region to oxide. The nitride and oxide pad is removed, and additional oxide is grown and etched to remove the oxynitride produced by the high temperature thermal oxidation. The LOCOS process consumes too much silicon and requires too large thermal budget to be useful in thin SOI processes.

Trench isolation requires an oxide pad and nitride layer. The nitride, oxide pad and all of the top silicon in the field region are etched and the trenches re-filled with oxide by oxide deposition and a CMP planarization process. This process induces a facet in the active area at the edge of the trench. The gate oxide in the facet is weaker than that at the top of the active area. The threshold voltage of the device in the facet may lower than that at the top active area.

SUMMARY OF THE INVENTION

A method of isolating a CMOS device on a silicon on insulator substrate, wherein the substrate includes an insulating layer having a layer of top silicon formed thereon, includes growing a gate oxide layer on the top silicon layer; depositing a first layer of material on the gate oxide layer; removing the first layer of material, the gate oxide layer and the top silicon layer from a device field region; forming an insulating cup about the first layer of material, the gate oxide layer and the top silicon layer; depositing a second layer of material over the first layer of material and the insulating cup; etching the first layer of material and the second layer of material to form a gate electrode; implanting ions to form a source region and a drain region; passivating the structure; and metallizing the structure.

An object of the invention is to eliminate the problems of mesa isolation, LOCOS, and trench isolation for SOI devices.

Another object of the invention is to provide a sidewall transistor having a high threshold voltage.

A further object of the invention is to provide a simplified device isolation method using minimal silicon.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENT

Figure 1:
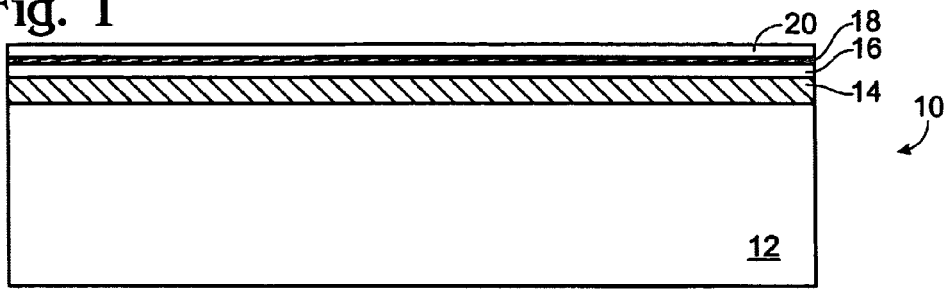
FIGS. 1–7 depict successive steps in the method of the invention.

The method of the invention provides separation of a gate electrode form active silicon with a thick layer of oxide. Referring to FIG. 1, a silicon on insulator (SOI) wafer 10 includes a substrate 12, an oxide layer 14, and a top silicon layer 16. Top silicon layer 16 is thinned by thermal oxidation to the desired thickness. For a fully depleted SOI wafer, the top silicon may have a thickness of between about 10 nm to 50 nm. For a partially depleted SOI wafer, the top silicon layer may be as thick as 4 μm.

Figure 2:
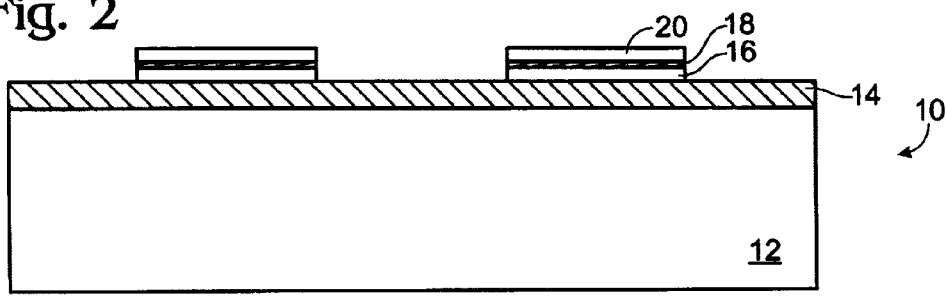

The wafer is next implanted with ions and the ions diffused to dope the top silicon to a proper doping density to meet the threshold voltage requirement. In the case of ion implantation to form an n silicon, phosphorus ions are implanted at a dose of between about $1 \cdot 10^{11}$ cm$^{-2}$ to $5 \cdot 10^{12}$ cm$^{-2}$, and at an energy level of between about 10 keV to 50 keV are implanted. Alternately, BF$_2$ ions may be implanted at the same dosage and at an energy level of between about 15 keV to 80 keV. A gate oxide layer 18 is grown, as by thermal oxidation. A first layer of material 20, which, in the preferred embodiment, is a polysilicon layer, is deposited by CVD to a thickness of between about 50 nm to 200 nm. The active area is masked with photoresist, and 20 polysilicon layer 20, gate oxide layer 18 and top silicon layer 16 are etched from the field region, resulting in the structure of FIG. 2. Polysilicon layer 20 comprises a portion of a gate electrode. The first layer may also be a layer of SiGe or silicon nitride, deposited to the same thickness as the polysilicon.

Figure 3:
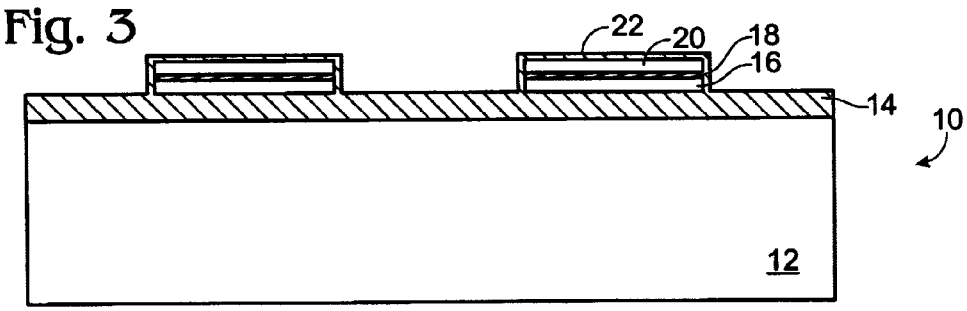
Figure 4:
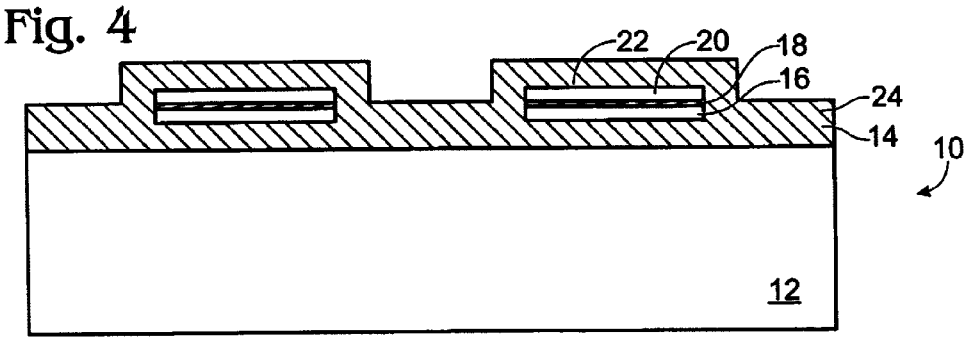

An oxide cup is formed about first polysilicon layer 20, oxide layer 18 and top silicon layer 16. This is a multi-step process which begins with formation of a layer of thermal oxide 22, which is grown by thermal oxidation, to a thickness of between about 2 nm to 20 nm. Thermal oxide layer 22 is provided to passivate the sidewall of the active silicon islands, as shown in FIG. 3. A layer of oxide 24 is deposited to a thickness of between about 50 nm to 200 nm, and preferably a thickness of between about 50 nm to 100 nm, by CVD, as shown in FIG. 4.

Figure 5:
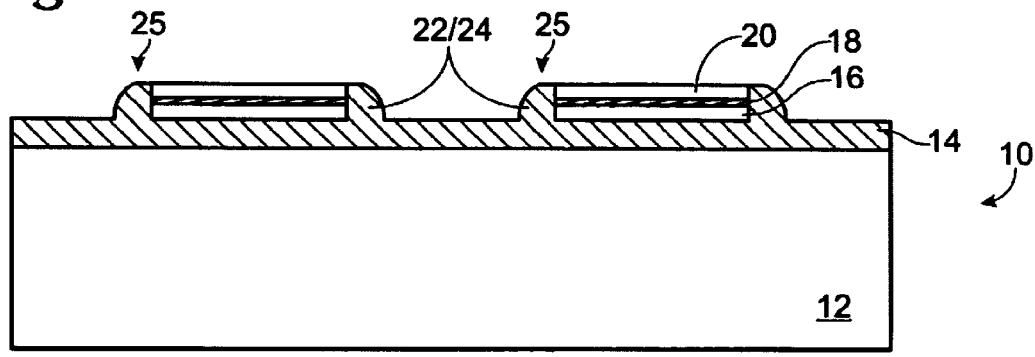

The portion of oxide overlying polysilicon layer 18 is removed by plasma etching At this point the plasma etch reaches the "end point," i.e., the sidewall of the polysilicon/silicon layer is passivated with 50 nm to 200 nm of oxide, as shown in FIG. 5. This provides complete device isolation, and form the oxide cup, shown generally at 25.

A second layer of material 26, which, in the preferred embodiment, is a layer of polysilicon, is deposited by CVD to a thickness of between about 50 nm to 200 nm. The combination of first layer 16 and second layer 26 provides a gate electrode. Layers 16/26 are masked with photoresist and etched, to form the structure shown in FIG. 6. The CMOS device is completed by implanting ions to form a source 28 and a drain 30 by any state-of-the-art processes. An oxide layer 32 is deposited by CVD, and the structure metallized 34, 36 and 38, as shown in FIG. 7.

Figure 6:
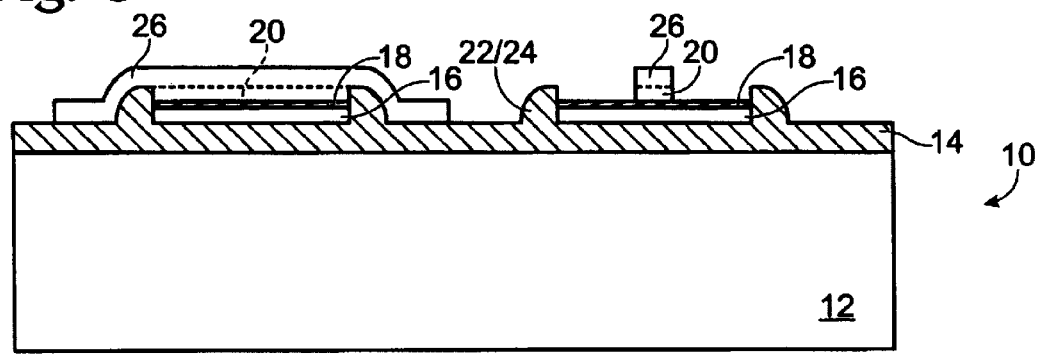
Figure 7:
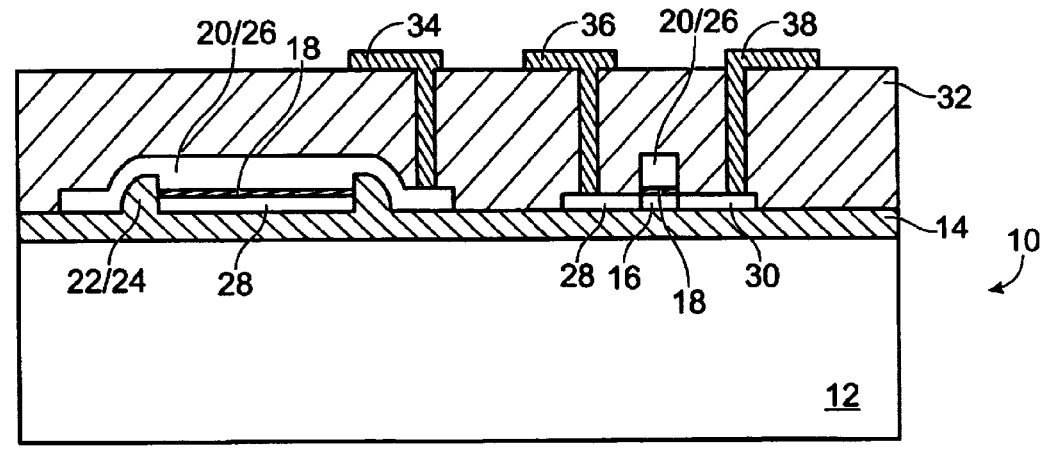

As is shown in FIG. 6, the gate oxide is grown on a flat surface. The gate electrode at the edge of the active area is separated from the active silicon by a thick layer of oxide. The threshold voltage of the sidewall transistor will be very high. The transistor will have good gate oxide integrity and no sidewall parasitic transistor leakage current. This isolation process consumes minimal amount of silicon and requires minimum thermal budget. The process is particularly useful to very thin SOI technology.

This isolation process may also be used for metal gate process. A thick oxide deposition step and a planarization step are added after the source/drain ion implantation. Passivation oxide is deposited on the two polysilicon layers. The first and second material layer structure are etched and the metal is deposited to form metal gate for the device. The two polysilicon layers may be replaced with silicon nitride, wherein the process becomes a nitride replacement metal gate process. The two nitride layers are deposited to the same thicknesses as the two polysilicon layers or the SiGe layer and the overlying polysilicon layer.

Thus, a method of SOI device isolation has been disclosed. It will be appreciated that further variations and modifications thereof may be made within the scope of the invention as defined in the appended claims.

I claim:

1. A method of isolating a CMOS device on a silicon on insulator substrate, wherein the substrate includes an insulating layer having a layer of top silicon formed thereon, comprising:

growing a gate oxide layer on the top silicon layer;

depositing a first layer of material on the gate oxide layer;

removing the first layer of material, the gate oxide layer and the top silicon layer from a device field region;

forming an insulating cup about the first layer of material, the gate oxide layer and the top silicon layer, including growing a layer of oxide by thermal oxidation about the first layer of material, the oxide layer and the top silicon layer; depositing a layer of oxide by CVD over the structure; and etching the oxide to the level of the first layer of material, leaving a sidewall;

depositing a second layer of material over the first layer of material and the insulating cup;

etching the first layer of material and the second layer of material to form a gate electrode;

implanting ions to form a source region and a drain region;

passivating the structure; and metallizing the structure.

2. The method of claim 1 wherein said depositing a first layer of material includes depositing a layer of material taken from the group of materials consisting of polysilicon, SiGe and silicon nitride.

3. The method of claim 2 wherein said depositing a first layer of material includes depositing a layer of material by CVD to a thickness of between about 50 nm to 200 nm.

4. The method of claim 1 wherein said depositing a second layer of material includes depositing a layer of material taken from the group of materials consisting of polysilicon and silicon nitride.

5. The method of claim 4 wherein said depositing a second layer of material includes depositing a layer of material by CVD to a thickness of between about 50 nm to 200 nm.

6. The method of claim 1 which includes, before said growing a gate oxide layer, thinning the top silicon layer and doping the thinned layer with doping impurities.

7. The method of claim 6 wherein the silicon on insulator substrate is fully depleted, and wherein the top silicon layer is thinned to a thickness of between about 10 nm to 50 nm.

8. The method of claim 6 wherein the silicon on insulator substrate is partially depleted, and wherein the top silicon layer is thinned to a thickness of less than or equal to four micrometers.

9. The method of claim 1 wherein the top silicon layer is doped with doping impurities taken from the group of impurities consisting of phosphorus ions, implanted at a dose of between about $1 \cdot 10^{11}$ cm$^{-2}$ to $5 \cdot 10^{12}$ cm$^{-2}$, and at an energy level of between about 10 keV to 50 keV, and BF$_2$ ions implanted at a does of between about $1 \cdot 10^{11}$ cm$^{-2}$ to $5 \cdot 10^{12}$ cm$^{-2}$, and at an energy level of between about 15 keV to 80 keV.

10. The method of claim 1 wherein said forming an insulating cup includes growing a layer of oxide by thermal oxidation about the first layer of material, the oxide layer and the top silicon layer; depositing a layer of oxide by CVD over the structure to a thickness of between about 50 nm to 200 nm; and etching the oxide to the level of the first layer of material, leaving a sidewall of between about 50 nm to 200 nm thick.

11. The method of claim 1 wherein the material of the first and second layers of material is silicon nitride, and which, after said implanting ions to form a source region and a drain region, includes planarizing the structure; removing the silicon nitride by etching; and depositing metal to form a metal gate electrode.

12. A method of isolating a CMOS device on a silicon on insulator substrate, wherein the substrate includes an insulating layer having a layer of top silicon formed thereon, comprising:

growing a gate oxide layer on the top silicon layer;

depositing a first layer of material taken from the group of materials consisting of polysilicon SiGe and silicon nitride on the gate oxide layer;

removing the first layer of material, the gate oxide layer and the top silicon layer from a device field region;

forming an insulating cup about the first layer of material, the gate oxide layer and the top silicon layer, including growing a layer of oxide by thermal oxidation about the first layer of material, the oxide layer and the top silicon layer; depositing a layer of oxide by CVD over the structure; and etching the oxide to the level of the first layer of material, leaving a sidewall;

depositing a second layer of material taken from the group of materials consisting of polysilicon and silicon nitride over the first layer of material and the insulating cup;

etching the first layer of material and the second layer of material to form a gate electrode;

implanting ions to form a source region and a drain region;

passivating the structure; and metallizing the structure.

13. The method of claim 12 which further includes, before said growing a gate oxide layer, thinning the top silicon layer and doping the thinned layer with doping impurities.

14. The method of claim 13 wherein the silicon on insulator substrate is fully depleted, and wherein the top silicon layer is thinned to a thickness of between about 20 nm to 50 nm.

15. The method of claim 13 wherein the silicon on insulator substrate is partially depleted, and wherein the top silicon layer is thinned to a thickness of less than or equal to four micrometers.

16. The method of claim 12 wherein the top silicon layer is doped with doping impurities taken from the group of impurities consisting of phosphorus ions, implanted at a dose of between about $1 \cdot 10^{11}$ cm$^{-2}$ to $5 \cdot 10^{12}$ cm$^{-2}$, and at an energy level of between about 10 keV to 50 keV, and BF$_2$ ions implanted at a does of between about $1 \cdot 10^{11}$ cm$^{-2}$ to $5 \cdot 10^{12}$ cm$^{-2}$, and at an energy level of between about 15 keV to 80 keV.

17. The method of claim 12 wherein said depositing a first layer of material includes depositing a layer of material by CVD to a thickness of between about 50 nm to 200 nm.

18. The method of claim 12 wherein said depositing a layer of oxide by CVD over the structure includes depositing oxide to a thickness of between about 50 nm to 200 nm; and wherein said etching the oxide to the level of the first layer of material, includes leaving a sidewall of between about 50 nm to 200 nm thick.

19. The method of claim 12 wherein said depositing a second layer of material includes depositing a layer of material by CVD to a thickness of between about 50 nm to 200 nm.

20. The method of claim 12 wherein the first layer of material is silicon nitride, and which, after said implanting ions to form a source region and a drain region, includes planarizing the structure; removing the silicon nitride by etching; and depositing metal to form a metal gate electrode.

21. A method of isolating a CMOS device on a silicon on insulator substrate, wherein the substrate includes an insulating layer having a layer of top silicon formed thereon, comprising:

thinning the top silicon layer and doping the thinned layer with doping impurities;

growing a gate oxide layer on the top silicon layer;

depositing a first layer of material taken from the group of materials consisting of polysilicon, SiGe and silicon nitride on the gate oxide layer by CVD to a thickness of between about 50 nm to 200 nm;

removing the first layer of material, the gate oxide layer and the top silicon layer from a device field region;

forming an insulating cup about the first layer of material, the gate oxide layer and the top silicon layer, including growing a layer of oxide by thermal oxidation about the first layer of material, the oxide layer and the top silicon layer; depositing a layer of oxide by CVD over the structure to a thickness of between about 50 nm to 200 nm; and etching the oxide to the level of the first layer of material, leaving a sidewall of between about 50 nm to 200 nm thick;

depositing a second layer of material taken from the group of materials consisting of polysilicon and silicon nitride over the first layer of material and the insulating cup by CVD to a thickness of between about 50 nm to 200 nm;

etching the first layer of material and the second layer of material to form a gate electrode;

implanting ions to form a source region and a drain region; passivating the structure; and 22. The method of claim 21 wherein the silicon on insulator substrate is fully depleted, and wherein the top silicon layer is thinned to a thickness of between about 10 nm to 50 nm.

23. The method of claim 21 wherein the silicon on insulator substrate is partially depleted, and wherein the top silicon layer is thinned to a thickness of less than or equal to four micrometers.

24. The method of claim 21 wherein the top silicon layer is doped with doping impurities taken from the group of impurities consisting of phosphorus ions, implanted at a dose of between about $1 \cdot 10^{11}$ cm$^{-2}$ to $5 \cdot 10^{12}$ cm$^{-2}$, and at an energy level of between about 10 keV to keV, and BF$_2$ ions implanted at a does of between about $1 \cdot 10^{11}$ cm$^{-2}$ to $5 \cdot 10^{12}$ cm$^{-2}$, and at level of between about 15 keV to 80 keV.

25. The method of claim 21 wherein the first layer of material is silicon nitride, and which, after said implanting ions to Loran a source region and a drain region, includes planarizing the structure; removing the silicon nitride by etching; and depositing metal to form a metal gate electrode.

* * * * *